(12) United States Patent
Kaneda

(10) Patent No.: US 6,668,112 B1
(45) Date of Patent: Dec. 23, 2003

(54) MULTIMODE LASER DIODE AND SIDE-COUPLED FIBER PACKAGE

(75) Inventor: Yushi Kaneda, Tucson, AZ (US)

(73) Assignee: NP Photonics, Inc., Tucson, AZ (US)

( * ) Notice: Subject to any disclaimer, the term of this patent is extended or adjusted under 35 U.S.C. 154(b) by 0 days.

(21) Appl. No.: 10/256,958

(22) Filed: Sep. 25, 2002

(51) Int. Cl.[7] .......................... G02B 6/26; H04B 10/12; H01S 3/08
(52) U.S. Cl. ...................... 385/31; 359/341.32; 372/108
(58) Field of Search ........................... 385/8, 9, 14, 25, 385/31; 359/341.3, 341.32, 341.33, 831, 833, 834, 861; 372/70, 98, 100, 106–108

(56) References Cited

U.S. PATENT DOCUMENTS

| 4,428,647 | A |   | 1/1984  | Sprague et al. |         |
|-----------|---|---|---------|----------------|---------|
| 4,763,975 | A |   | 8/1988  | Scifres et al. |         |
| 4,822,150 | A | * | 4/1989  | Duarte         | 359/487 |
| 5,168,401 | A |   | 12/1992 | Endriz         |         |
| 5,533,152 | A |   | 7/1996  | Kessler        |         |
| 5,579,422 | A |   | 11/1996 | Head et al.    |         |
| 5,592,333 | A |   | 1/1997  | Lewis          |         |
| 5,629,997 | A |   | 5/1997  | Hardy, Jr.     |         |
| 5,854,865 | A |   | 12/1998 | Goldberg       |         |
| 6,262,413 | B1| * | 7/2001  | Taniguchi et al.| 250/216|
| 2002/0025096 | A1 | | 2/2002 | Wang et al.    |         |

FOREIGN PATENT DOCUMENTS

WO    WO 01/48878 A1    7/2001

OTHER PUBLICATIONS

U.S. patent application Ser. No. 09/943,257, Kaneda et al., pending.
Hidehiko Yoda et al., A New Scheme of a Lensed Fiber Employing a Wedge–Shaped Graded–Index Fiber Tip for the Coupling Between High–Power Laser Diodes and Single–Mode Fibers, Journal of LightWave Technology, Dec. 2001, PP. 1910–1917, vol. 19, No. 12, 2001 IEEE.

* cited by examiner

Primary Examiner—Georgia Epps
Assistant Examiner—William Choi
(74) Attorney, Agent, or Firm—Eric A. Gifford

(57) ABSTRACT

A multimode diode package and pump-coupler package are provided with a beam rotator that facilitates efficient packaging of a multimode diode laser with a side-coupled optical fiber. The beam rotator comprises a pair of reflective surfaces that perform/a pair of "off-plane bounces" to rotate the beam's fast axis. In an XYZ coordinate system, if the diode lies in the XZ-plane and emits the beam along the Z-axis with its fast-axis along the Y-axis, the first reflective surface folds the beam along the Y-axis and its fast-axis along the Z-axis. The second reflective surface folds the beam along the X-axis and leaves the fast-axis along the Z-axis. The fiber is mounted in the XZ-plane along the Z-axis parallel to the fast-axis.

30 Claims, 10 Drawing Sheets

MULTIMODE LASER DIODE AND SIDE-COUPLED FIBER PACKAGE

BACKGROUND OF THE INVENTION

1. Field of the Invention

This invention relates to packaging optical fibers and more specifically to packaging a multimode laser diode that is side-coupled with a double-clad fiber.

2. Description of the Related Art

Optical fiber lasers and fiber amplifiers have become indispensable components in building optical networks for the transmission and amplification of optical signals. Optical amplification is achieved by pumping the fiber's doped core. Typically, the pump light is coupled directly into the doped core. This requires single spatial mode diffraction limited laser diodes with an emission aperture of a few microns. This process is expensive because of the sub-micron alignment and mechanical stability required to achieve efficient and stable diode to fiber coupling. A relatively current development is the use of double-clad active fibers that consist of a single mode fiber doped core, an inner cladding and an outer cladding. The large diameter and numerical aperture of the outer cladding make it possible to efficiently couple spatially incoherent emission from high power multimode diodes into the fiber. These broad area laser diodes are approximately ten times cheaper than pigtailed single mode laser diodes.

As shown in FIG. 1a, a multimode diode laser 10 includes a chip 12 on a submount 14 that emits a laser beam 16 in a direction parallel to the diode's mounting surface 18. As shown in FIGS. 1b and 1c, the laser diode submount 14 can be mounted on a base plate 15 with diode mounting surface 18 parallel to the base plate surface 19. In this configuration, the laser beam 16 is emitted in a direction parallel to the surfaces 18 and 19, corresponding to the Z direction as described in FIG. 1a. The laser beam 16 can be redirected by the use of a 45° mirror 25 or any other reflective surface as shown in FIG. 1c. In this case, the laser beam 16 is now propagating in the direction Y perpendicular to the base plate surface 19. In the configuration shown in FIG. 1d, the chip 12 can be mounted on the side of a submount 14, which has a chip mounting surface 18 that is perpendicular to the base plate surface 19. The choice of diode configuration will be dictated by the application, package size limitations and type of coupler. Multimode diode laser 10 suitably comprises either a single broad emitting area or an array of single transverse mode lasers.

Because the active region 20 of chip 12 is more confined in the Y direction than in the X direction, the intensity distribution of beam 16 is more diffracted in the direction of high confinement, leading to an elliptical distribution with the slow axis 22 along the X direction and a fast axis 24 along the Y direction. When the chip 12 is mounted parallel to the base plate surface 19 as shown in FIG. 1b, fast axis 24 is perpendicular to base plate surface 19 and active region 20. When mirror 25 is used to redirect the beam as shown in FIG. 1c, or when the laser chip is mounted on the end of submount 14 as shown in FIG. 1d, fast axis 24 is parallel to base plate surface 19.

Because the thickness of the semiconductor active region 20 is much smaller than its width, focusing along the fast axis is easier than along the slow axis. A number of different optical systems have been proposed that use some combination of one or more simple lenses, cylindrical lenses, microlens arrays, fibers and waveguides to reimage the sources so as to reduce one of the asymmetries inherent in laser bars or multimode laser diodes with broad area emitters. For example, the use of lenses is disclosed in U.S. Pat. No. 4,428,647 and the use of fibers in U.S. Pat. No. 4,763,975.

The multimode pump can be coupled into the fiber's inner cladding in a number of ways. The multimode pump shown in FIG. 1b can be "butt" coupled to an open end of the fiber. The orientation of the fast-axis is not critical because the open end of the fiber is axially symmetric. However, this configuration does not provide access to both ends of the fiber. The same multimode pump can also be coupled to the fiber by using a special fused fiber coupler which allows pump light to be transferred from a multimode fiber into the fiber's inner cladding without disturbing the signal propagating in the core. However, such fused fiber couplers are inefficient, complex and expensive.

U.S. Pat. No. 5,854,865 to Goldberg teaches forming a groove in the side of the double-clad fiber to "side-couple" the multimode pump into the fiber. The laser diode is placed on the other side of the fiber so that the pump propagates laterally through the fiber and impinges on the side of the groove, which specularly reflects the pump along the horizontal axis of the fiber confined in the inner cladding. The formation of such grooves is a complex manufacturing process that weakens the fibers and requires relative large inner cladding diameters, which reduces coupling efficiency.

Packaging the multimode diodes, couplers and fibers is oftentimes the most challenging aspect of providing a commercially viable fiber laser or fiber amplifier. The package must provide (a) sufficient and cost-effective heat sinking, (b) efficiently couple the pump into the fiber, which means, in part, orienting the fast-axis parallel to the fiber at the coupler when the coupling aperture is not axially symmetric, (c) thermal isolation of the fiber from the diode, and (d) a simple, compact and reliable package.

International publication WO 01/48878A1 entitled "Hybrid Optical Coupling Component" discloses a configuration for packaging a multimode diode laser of the type shown in FIG. 1d above with Goldberg's V-groove fiber coupler. A fiber 30 formed with the v-groove coupler 32 is mounted directly above diode 10 in a glass block 31 so that beam 16 emits perpendicular to the plane of the mounting surface with its fast-axis 24 oriented parallel to fiber 30. The coupling aperture into the fiber is not axially symmetric so proper orientation of the fast-axis is critical to efficient coupling. Beam 16 passes through imaging lens 34, propagates laterally through fiber 30 and is reflected off the v-groove horizontally along the fiber. This package provides adequate but sub-optimal heat sinking. The chip 12 is mounted flat on end surface 18 of sub-mount 14 to maximize surface area but the heat path from the chip 12 to end surface 18 of sub-mount 14, and to surface 19 of base plate 15 is not straight. This makes the heat path longer, reducing the efficiency of the heat sinking. Furthermore, The package provides poor thermal isolation because fiber 30 is mounted directly on top of diode 10. Heat and particularly fluctuations in temperature can change the characteristics of the gain fiber. In addition, placement of fiber 30 on top of the diode is a delicate and unreliable packaging challenge and also increases the package height, which is a critical parameter in many applications.

SUMMARY OF THE INVENTION

The present invention provides a simple, compact and reliable package for optical amplification that provides efficient coupling of the multimode pump to the double-clad fiber, sufficient heat sinking and good thermal isolation.

This is accomplished with a multimode laser diode mounted with its active region parallel to a mounting surface. The diode emits a beam parallel to the mounting surface with a fast-axis of the beam perpendicular to the diode's active region and the mounting surface. A beam rotator rotates the beam so that the beam's fast-axis is oriented parallel to the mounting surface. A multimode diode package of only the diode and rotator may be provided for integration with a side-coupled fiber.

The beam rotator comprises a pair of reflective surfaces such as provided by mirrors, a prism or a tilted v-shaped mirror that perform a pair of "off-plane bounces" to rotate the beam's fast axis. In an XYZ coordinate system, if the diode lies in the XZ-plane and emits the beam along the Z-axis with its fast-axis along the Y-axis, the first reflective surface folds the beam along the Y-axis and its fast-axis along the Z-axis. The second reflective surface folds the beam along the X-axis and leaves the fast-axis along the Z-axis. The fiber is mounted in the XZ-plane along the Z-axis parallel to the fast-axis.

A pump-coupler package will also include a double-clad fiber having a core, an inner cladding and an outer cladding is mounted on the mounting surface adjacent the laser diode and substantially parallel to the orientation of the beam's fast axis. An imaging lens is placed between the rotator and a side-coupler that couples the shaped and properly oriented beam into the fiber's inner cladding through a side of the fiber. In turn, the beam is coupled into an active portion of the double-clad fiber having a doped core to provide optical amplification. Suitable side-couplers include a V-groove or a TIR coupler, which can be formed directly on the active double-clad fiber or on a passive double-clad fiber connected to the active-double clad fiber. The diode laser and rotator can be integrated in a single package with the other components or provided as a package for integration into a second package.

These and other features and advantages of the invention will be apparent to those skilled in the art from the following detailed description of preferred embodiments, taken together with the accompanying drawings, in which:

DETAILED DESCRIPTION OF THE INVENTION

Figure 1A:
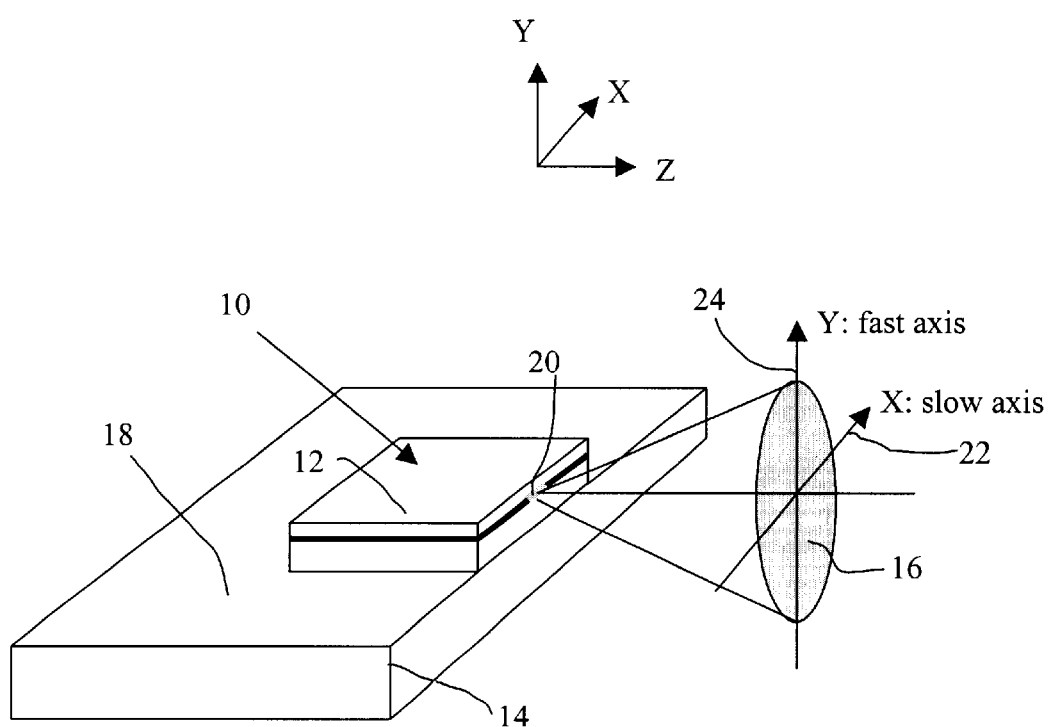
FIGS. 1a through 1d, as described above, are schematic diagrams of different multimode chip-on-submount laser diodes.
Figure 1B:
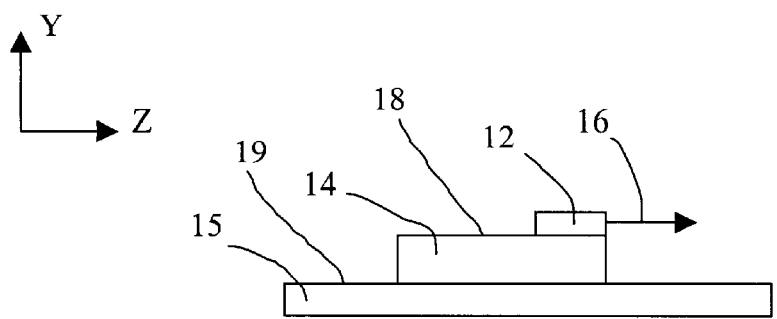
Figure 1C:
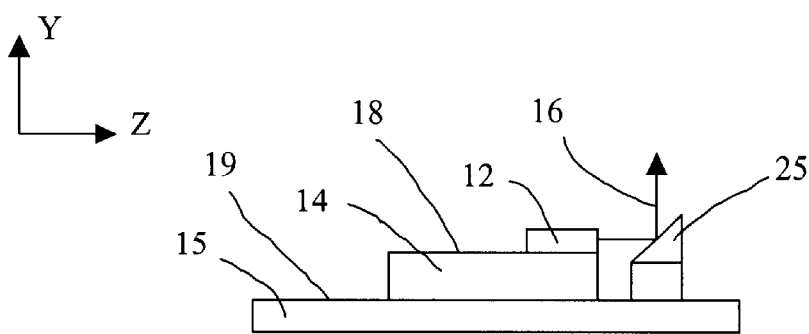
Figure 1D:
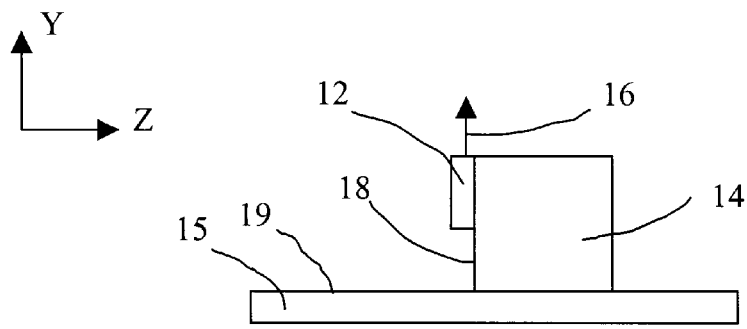
Figure 2:
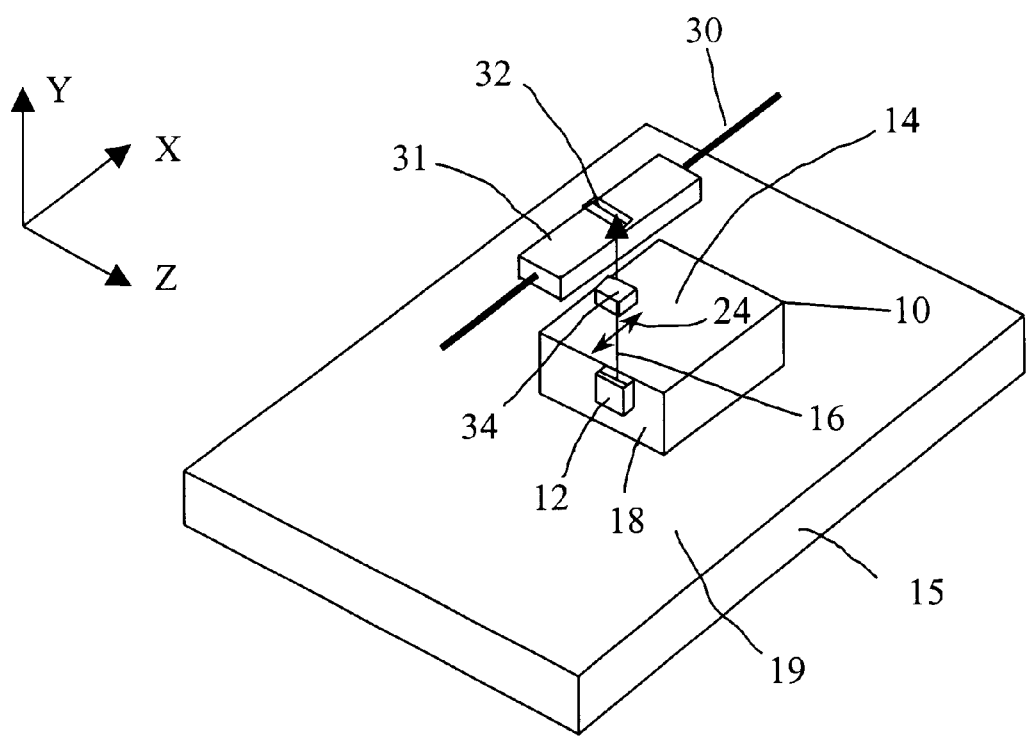
FIG. 2, as described above, is a diagram illustrating a package for the laser diode shown in FIG. 1d with an optical fiber formed with a V-groove side-coupler.

The present invention provides a package for an optical amplification system that includes a multimode diode, a beam rotator, fiber having an active portion, and a side-coupler. The pump-coupler package includes the diode, rotator, side-coupler, lens and fiber in a single integrated package. A multimode diode package of only the diode and rotator may be provided for integration with a side-coupled fiber.

The packages provide (a) sufficient and cost-effective heat sinking, (b) efficient coupling the pump into the fiber, which means, in part, orienting the fast-axis parallel to the fiber at the coupler where the fiber aperture is not axially symmetric, e.g. elliptical, (c) thermal isolation of the fiber from the diode, and (d) a simple, compact and reliable package.

As shown in FIGS. 3a through 3d, a multimode diode package 50 includes a multimode laser diode 52 and a beam rotator 54 configured so that when package 50 is mounted flat on a mounting surface 56 for effective heat sinking. Multimode laser diode 52 comprises a chip 64 that is preferably mounted on a submount 66 with its active region 68 parallel to a mounting surface 56. In this configuration, the beam 58 emitted through window 60 of the package and the beam's fast-axis 62 are both parallel to the plane of the chip's active region and the mounting surface for effective coupling to a side-coupled double-clad fiber. This subpackage provides effective heat sinking of the diode, efficient coupling to a fiber, thermal isolation from the fiber, and simple, compact and reliable package. Package 50 can be hermetic or non-hermetic depending upon the application.

Beam rotator 54 rotates the beam so that the beam's fast-axis is oriented parallel to the mounting surface. Beam rotator 54 comprises a pair of reflective surfaces 70 and 72 such as provided by mirrors 74a and 74b (FIG. 3a), a prism 76 (FIG. 3b) or a tilted v-shaped mirror 78 (FIG. 3c) that perform a pair of "off-plane bounces" to rotate the beam's fast axis. The angle between the reflective surfaces should be 60 degrees. This is found by taking the inner product of the surface normal vectors between the two surfaces $(0,1/\sqrt{2},-1/\sqrt{2})\cdot(1/\sqrt{2},-1/\sqrt{2},0)$, which gives $-\frac{1}{2}$, indicating the angle between the two surface normal vectors is 120 degrees, and the angle between the surfaces is 60 degrees.

In an XYZ coordinate system, if the diode 52 lies in the XZ-plane and emits the beam 58 along the Z-axis with its fast-axis 62 along the Y-axis, the first reflective surface 70 folds the beam, which is 45° to the reflective surface normal, along the Y-axis and its fast-axis, which is parallel to the plane of incidence, along the Z-axis. The second reflective surface 72 folds the beam, which is 45° to the reflective surface normal, along the X-axis and leaves the fast-axis, which is perpendicular to the plane of incidence, along the Z-axis. The different surface configurations function in the same manner, the only difference being the ease and cost of manufacture and packaging. A pair of mirrors requires precise alignment and packaging. The prism is easier to package but harder to manufacturer as each one has to be fabricated separately. The V-shaped mirror can be drawn like a fiber and then diced, which is much cheaper and easier to package.

Figure 3A:
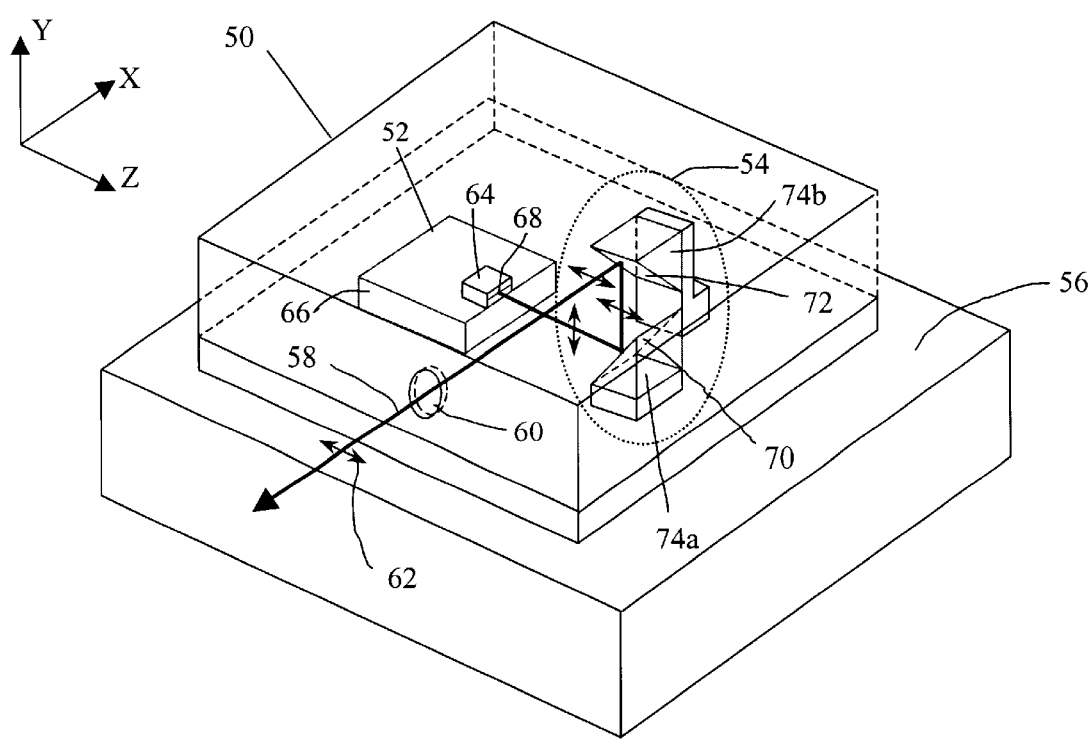
FIGS. 3a through 3d are diagrams illustrating a multimode diode package.
Figure 3B:
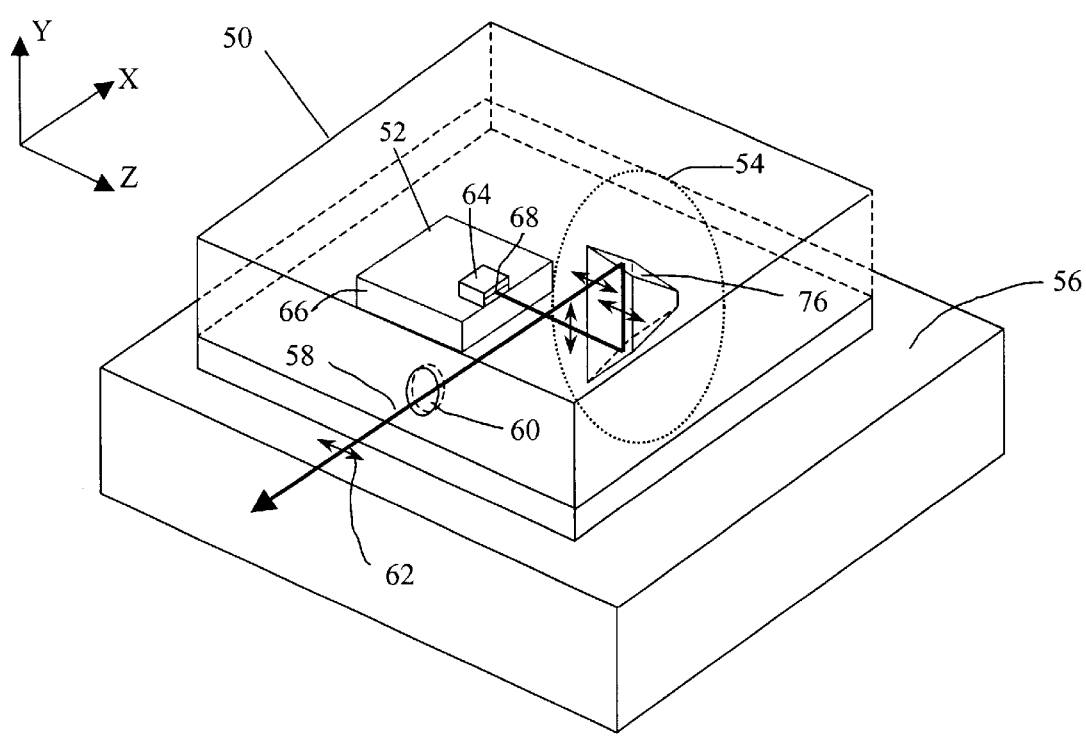
Figure 3C:
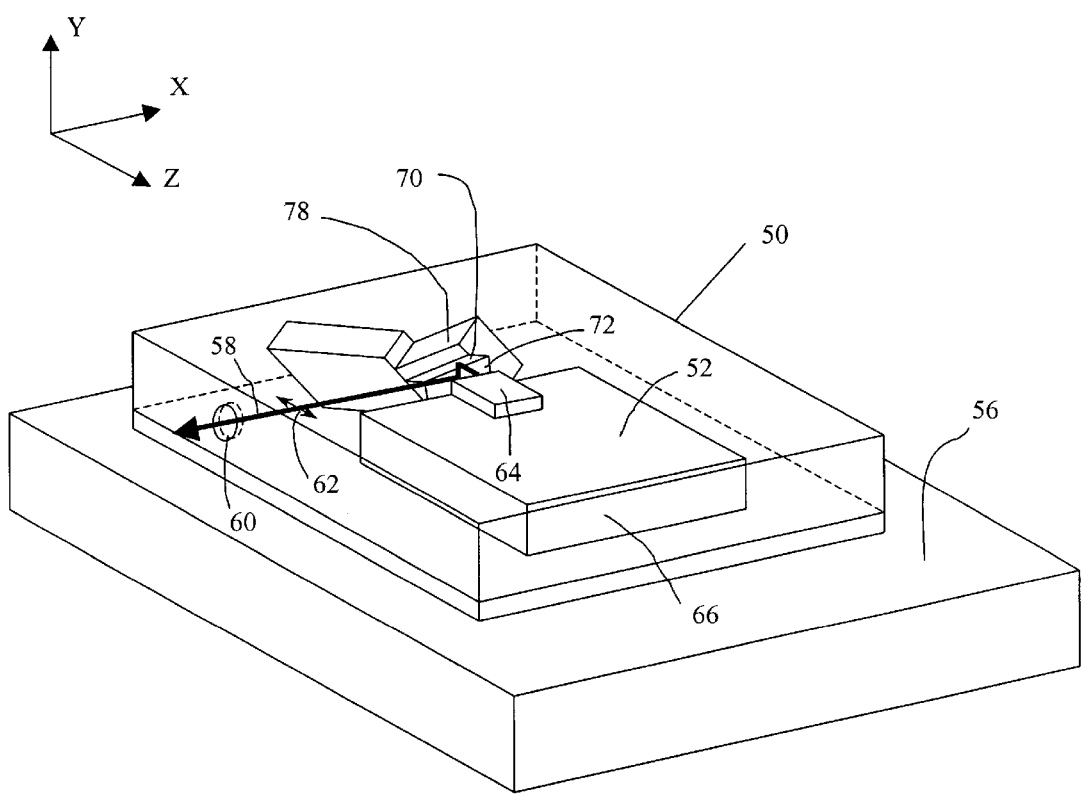
Figure 3D:
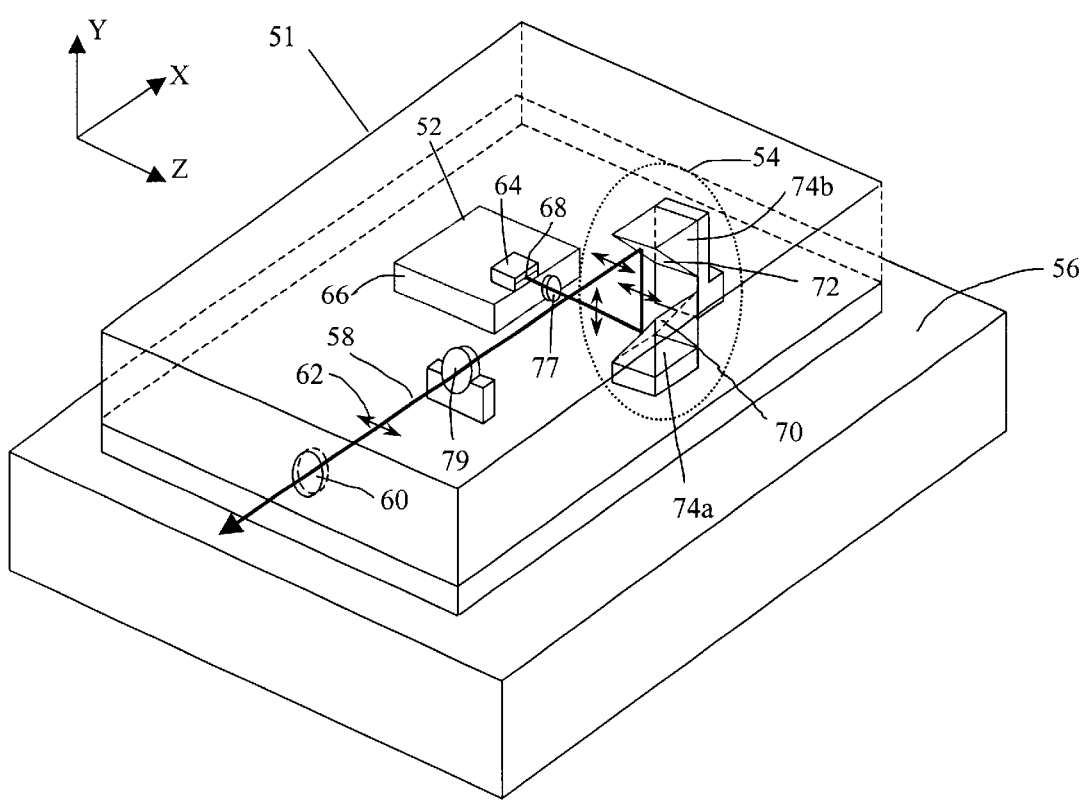

In another embodiment, package 51 also contains a first collimating lens 77 and a second imaging lens 79 as shown in FIG. 3d. The inclusion of the collimating lens 77 and imaging lens 79 eliminates the requirement of lens outside the multimode diode package.

As a result, multimode diode packages 50 and 51 when mounted flat on a mounting surface emits a beam that is parallel to the mounting surface with a fast-axis parallel to the mounting surface. As such packages 50 and 51 are well suited for integration with side-coupled optical fibers mounted on the mounting surface for applications such as fiber lasers or fiber amplifiers. When the pump beam is coupled from the side of the fiber via a V-groove or TIR coupler the aperture imaged by the beam is not axially symmetric. As a result, to achieve high coupling efficiency it is critical that the incident beam be well collimated. The nature of the multimode diode is such that the beam is only well collimated in its fast-axis, hence the beam's fast-axis must be parallel to the fiber, which requires that it first be parallel to the mounting surface.

Figure 4:
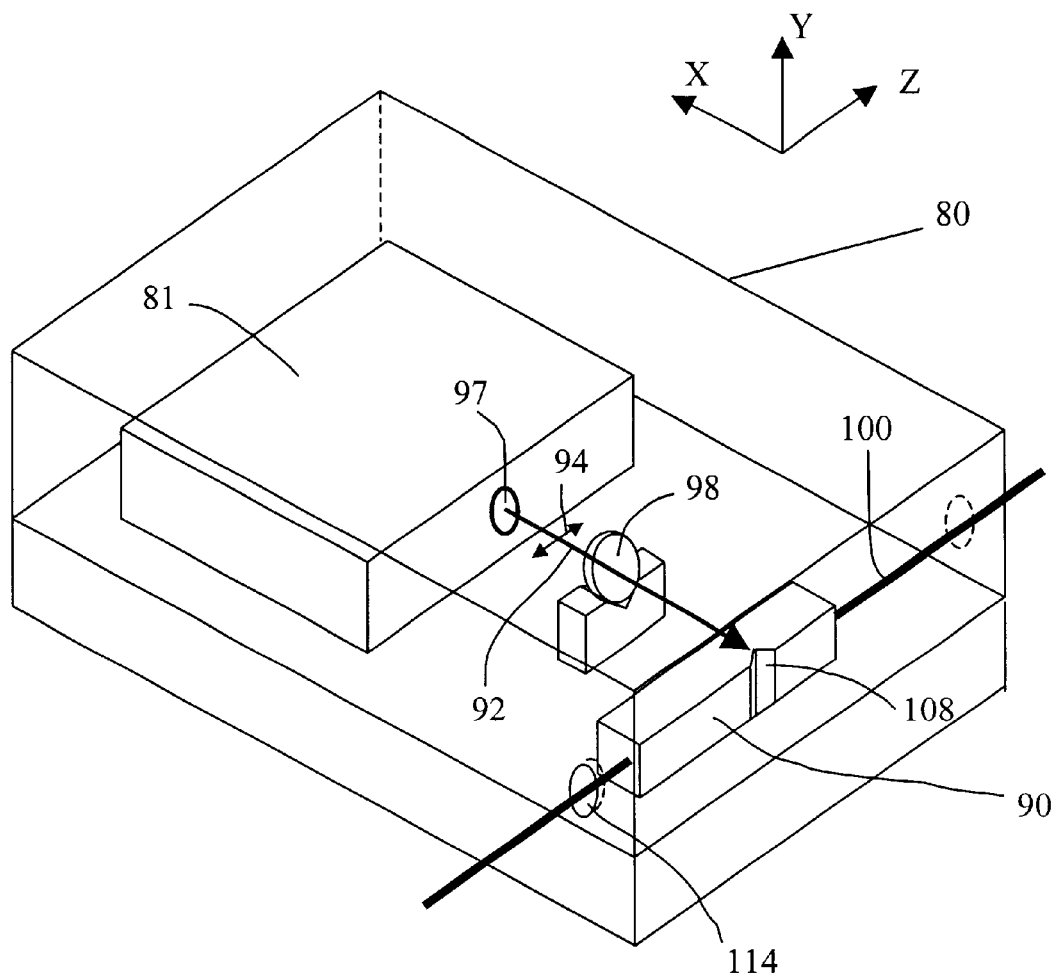
FIG. 4 is a diagram illustrating a pump-coupler package with a V-groove side-coupler.
Figure 5:
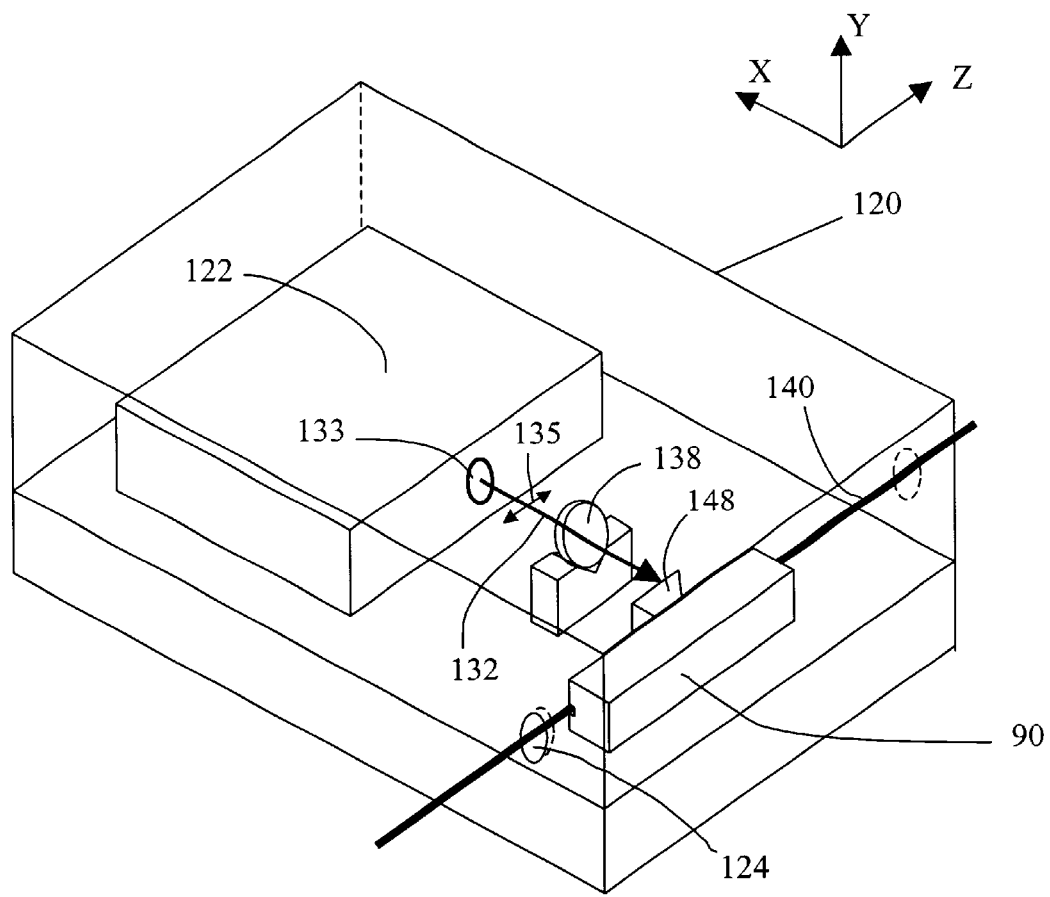
FIG. 5 is a diagram illustrating a pump-coupler package with a TIR side-coupler.

As shown in FIGS. 4 and 5, a double-clad fiber 100 having a core, an inner cladding and an outer cladding is mounted in the XZ-plane along the Z-axis adjacent multimode diode package 81. An imaging lens 98 shapes the beam 92, which has been rotated so that its fast-axis is parallel to the mounting surface and fiber 100, into a side-coupler 108 that couples the shaped and properly oriented beam into the fiber's inner cladding through a side of the fiber. In turn, the beam is coupled into an active portion of the double-clad fiber having a doped core to provide optical amplification. The fiber 100 and side-coupler 108 are mounted on block 90. The fiber can be a conventional silica fiber or a specialty glass fiber such as phosphate glass. Suitable side-couplers 108 include a V-groove as shown in FIG. 4 or a TIR coupler as shown in FIG. 5, which can be formed directly on the active double-clad fiber or on a passive double-clad fiber connected to the active-double clad fiber (see FIG. 6). When package 81 also includes a collimating lens and an imaging lens, lens 98 in package 80 is not required. As shown, multimode diode packages 81 and 122 of the type described in FIGS. 3a–3d the integrated with the other components inside a second package 80 and 120, respectively. Alternately, all of the components could be integrated into a single package. The choice will be dictated by size, cost, packaging requirements and availability of packaged diodes.

As will be appreciated by those skilled in the art, the described package presents a simple optical configuration designed to optimize coupling efficiency of the beam into the double-clad fiber. Without departing from the scope of the invention, one of ordinary skill in the art could employ one or more turning mirrors if so desired to redirect the path of the beam emitted by the multimode diode package. This may be desirable to reorient the fiber on the mounting surface for packaging reasons. Furthermore, one of ordinary skill in the art could design the beam rotator to provide sub-optimal coupling efficiency by configuring the reflecting surface to provide reflections other than 90 degrees so that the fast-axis is not exactly parallel to the fiber.

As shown in FIG. 4, a pump-coupler package 80 includes a multimode diode package 81 that houses a multimode laser diode and a beam rotator. The beam 92 is emitted through a window 97 formed in package 81 with its fast-axis 94 parallel to the mounting surface. An imaging lens 98 shapes the beam so that it propagates laterally through a double-clad fiber 100 with its fast-axis parallel to the fiber. The beam impinges on the side of a v-groove 108 formed in the outer cladding of fiber 100, which presents a non-axially symmetric, e.g. elliptical, aperture to the beam. V-groove 108 specularly reflects the beam along the horizontal axis of the fiber confined in the inner cladding. In turn, the beam is coupled into an active portion of the double-clad fiber having a doped core to provide optical amplification. The entire fiber 100 may have a doped core or, alternately, the portion of the fiber where coupling occurs may have an undoped core to reduce noise.

Pump-coupler package 80 may form either a hermetic or non-hermetic seal around the optical components and has at least one port 114 through which at least one end of fiber 100 extends. For example, multimode diode package 81 may provide the required hermetic seal to protect the diode so that package 80 can be a cheaper non-hermetic package. When configured as a fiber amplifier, the fiber will extend through ports on either end of the package. When configured as a fiber laser, the fiber may extend through only one such port.

As shown in FIG. 5, a pump-coupler package 120 includes a multimode laser diode 122 that houses a multimode laser and a beam rotator. A double-clad fiber 140 having a core, an inner cladding and an outer cladding is mounted on a glass block 90 adjacent multimode diode package 122. A Total Internal Reflection (TIR) coupler 148 is formed on a flat surface of the inner cladding of fiber 140. The reflection of a beam into the fiber presents a non-axially symmetric, e.g. elliptical, aperture to the beam. Accordingly, the beam rotator rotates beam 132, which is emitted through a window 133 formed in package 122, with its fast-axis 135 parallel to the mounting surface and fiber 140. An imaging lens 138 shapes the properly oriented beam 132 so that it enters TIR coupler 148, which couples the beam into and along the horizontal axis of the fiber confined in the inner cladding. In turn, the beam is coupled into an active portion of the double-clad fiber having a doped core to provide optical amplification. The entire fiber 140 may have a doped core or, alternately, the portion of the fiber where coupling occurs may have an undoped core to reduce noise (see FIG. 6 below).

Pump-coupler package 120 may form either a hermetic or non-hermetic seal around the optical components and has at least one port 124 through which at least one end of fiber 140 extends. For example, multimode diode package 122 may provide the required hermetic seal to protect the diode so that package 120 can be a cheaper non-hermetic package. When configured as a fiber amplifier, the fiber will extend through ports on either end of the package. When configured as a fiber laser, the fiber may extend through only one such port. When package 122 also includes a collimating lens and an imaging lens, lens 138 in package 120 is not required.

The TIR coupler 148 is compact and can provide coupling efficiencies exceeding 90%. As described in co-pending U.S. patent application Ser. No. 09/943,257 entitled "Total Internal Reflection (TIR) Coupler and Method for Side-Coupling Pump Light into a Fiber", which is hereby incorporated by reference, efficient coupling is accomplished by bonding a TIR coupler in optical contact to the fiber's inner cladding; either the active or passive double-clad fiber. The inner cladding, which surrounds a core, has at least one flat surface and is transparent to the pump wavelength. The diode laser directs light into the TIR coupler from either the front or backside of the fiber, which is mounted on a substrate. The beam is preferably oriented substantially normal to the fiber to simplify packaging, facilitate the use of a multimode pump and simplify the design of any anti-reflection (AR) coatings.

The TIR coupler has an angle of taper $\alpha$ and a length L such the principal ray of the pump light is reflected at an angle that satisfies the total internal reflection (TIR) condition at the coupler's reflecting surface, and input and output coupling conditions, to efficiently "fold" the light into the fiber and satisfies the TIR condition inside the fiber to "guide" the light down the fiber's inner cladding. The angle of incidence is preferably such that substantially all of the pump light (principal and marginal rays) satisfies the TIR condition. The pump light is preferably focused to obtain such high coupling efficiencies and to confine the light within a narrow cladding, which produces higher power density.

Figure 6:
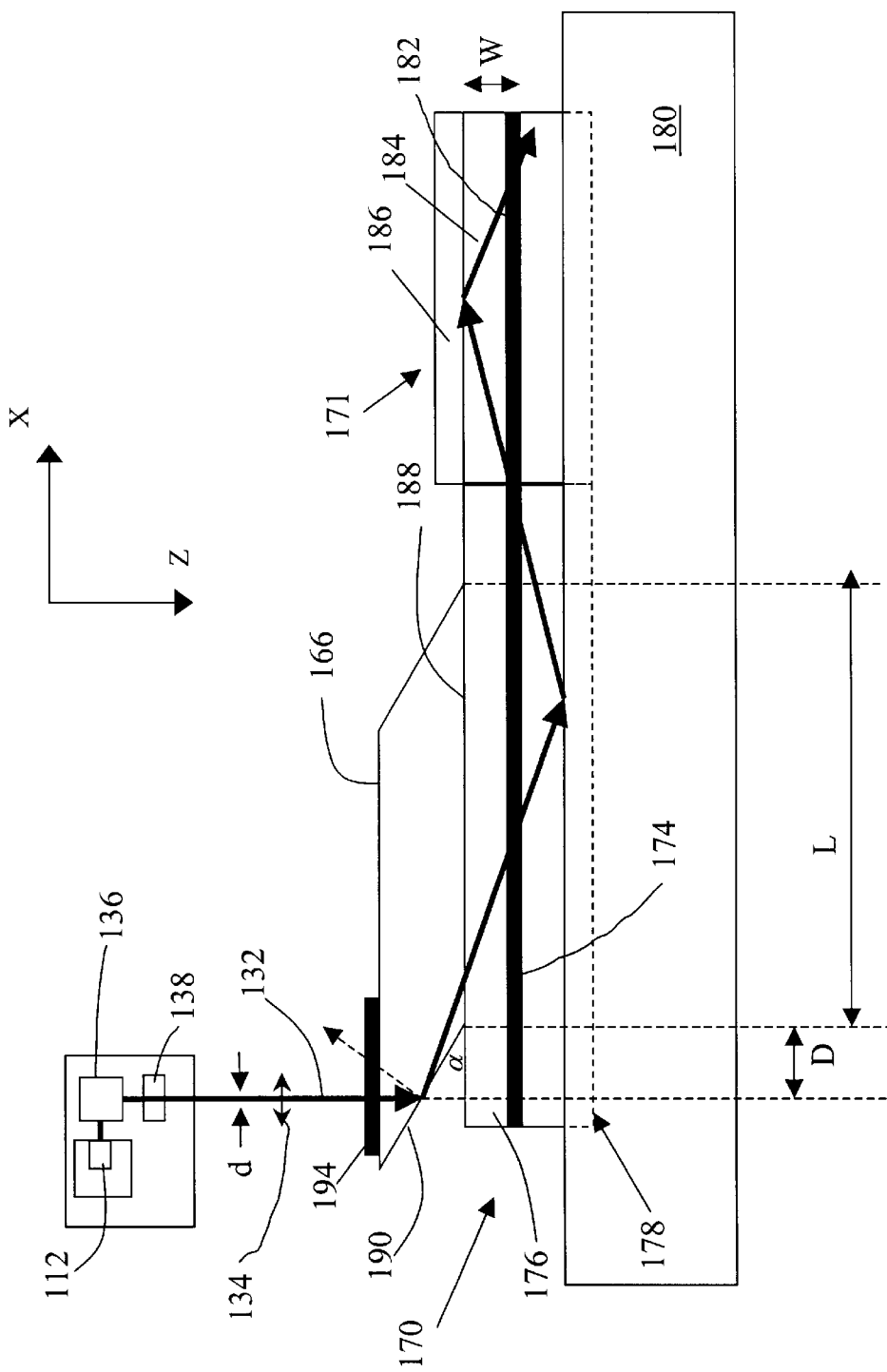
FIG. 6 is a detailed diagram of a passive TIR side-coupler.

As shown in FIG. 6, a "passive coupler" includes a TIR coupler 166 mounted on passive double-clad fiber 170, which is optically coupled to an active double-clad fiber 171. Double-clad fiber 170 comprises an undoped core 174, an inner cladding 176 and a partial outer cladding 178 and is mounted on a mounting surface 180. Active fiber 171 comprises a doped core 182, an inner cladding 184 and an outer cladding 186 and is also mounted on mounting surface 180. TIR coupler 166 is bonded in optical contact to a flat surface 188 on the passive fiber's inner cladding 176 towards an I/O port for receiving the incident beam for length L.

TIR coupler 166 has a reflecting surface 190 that forms an exterior angle of taper α with respect to surface 188. In this example, and as will typically be the case, the cores and inner claddings of the passive and active fibers are substantially matched in both refractive index and cross-section. Multimode laser diode 112, rotator 136 and lens 138 are positioned on the front side of mounting surface 180 so that a pump beam 132 having finite width d is substantially normal to the fiber with its fast-axis 134 substantially parallel to the fiber. Pump beam 132 passes through AR coating 194, reflects off surface 190 and is folded into passive fiber 170, which in turn guides the pump light into active fiber 171 thereby exciting the entire length of doped core 182 in the active fiber. Assuming a substantially collimated beam and index-matched fibers, the constraint equations for the passive coupler shown in FIG. 6 are given by:

$$\frac{\pi - \theta_i}{2} > \arcsin\left(\frac{1}{n_{coupler}}\right) \quad (1)$$

$$\theta_L > \arcsin\left(\frac{n_{ext}}{n_{clad}}\right) \quad (2)$$

$$\frac{(|D| + d/2)}{\cos\theta_i} < L < \frac{(|D| - d/2)}{\cos\theta_i} + 2W\tan\theta_L \quad (3)$$

$$d_{max} = 2W \tan\theta_L \cos\theta_i \quad (4)$$

where $n_{coupler}$ is the refractive index of the coupler and the surrounding media is air;

$n_{clad}$ is the refractive index of the fibers' inner cladding;

$n_{ext}$ is the refractive index of the active fiber's outer cladding;

W is the diameter of the active fiber's inner cladding;

|D| is the lateral distance from the starting point of the taper to the point where the beam of pump light strikes the reflecting surface as projected onto the fiber where || is the absolute value operation;

$d_{max}$ is the maximum beam diameter for d;

$\theta_i$ is the angle of incidence at the coupler-fiber interface and is dictated by the geometry of the taper and the angle of incidence $\theta_{inc}$ at the air-coupler interface;

$\theta_{inc}$ is the angle of incidence of the pump light with respect to the reflecting surface, e.g. the angle measured from the normal to the reflecting surface to principal ray of the incident light, $\theta_{inc}$ is equal to $(\pi-\theta_i)/2$ for a pump source that is oriented normal to the fiber; and $\theta_L$ is the launch angle of the pump light into the fiber, which in many cases where the coupler and inner cladding are index matched, the launch and incidence angles at the coupler-fiber interface are the same.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A multimode diode package, comprising:

A multimode laser diode having an active region, said diode emitting a beam parallel to its active region with a fast-axis of the beam perpendicular to the active region; and A beam rotator that rotates the beam so that the beam and its fast-axis are oriented substantially parallel to the active region.

2. A multimode diode package of claim 1, wherein the multimode laser diode comprises, A submount having a top surface, and A chip including the active region mounted on the submount's top surface and emitting the beam parallel to that top surface.

3. A multimode diode package of claim 1, wherein the multimode laser diode comprises, A submount having a top surface and an end surface, and A chip including the active region mounted on the submount's end surface and emitting the beam perpendicular to that top surface, and Further comprising a turning mirror that folds the beam so that it is emitted parallel to the top surface.

4. A multimode diode package of claim 1, wherein the beam rotator comprises first and second reflective surfaces that perform a pair of "off-plane bounces" to rotate the beam so that the beam and its fast-axis are oriented substantially parallel to the active region.

5. A multimode diode package of claim 4, wherein in an XYZ coordinate system, if the diode's active region lies in the XZ-plane and emits the beam along the Z-axis with its fast-axis along the Y-axis, the first reflective surface folds the beam along the Y-axis and its fast-axis along the Z-axis and the second reflective surface folds the beam along the X-axis and leaves the fast-axis along the Z-axis.

6. A multimode diode package of claim 5, wherein said first and second reflective surface form an angle of approximately 60° to each other.

7. A multimode diode package of claim 5, wherein the first and second reflective surface are provided from a pair of mirrors, a prism or a tilted v-groove mirror.

8. A multimode diode package of claim 1, further comprising;

A package that houses the multimode laser diode and the beam rotator, and

A window formed in the package through which the beam is emitted.

9. A pump-coupler package for providing optical amplification, comprising:

A multimode laser diode mounted with its active region parallel to a mounting surface, said diode emitting a beam parallel to the mounting surface with a fast-axis of the beam perpendicular to the mounting surface;

A double-clad fiber having a core, an inner cladding and an outer cladding, said fiber being mounted on the mounting surface adjacent the laser diode;

A beam rotator that rotates the beam so that the beam's fast-axis is oriented substantially parallel to the mounting surface and the fiber;

A lens that shapes the beam; and

A side-coupler that couples the shaped and properly oriented beam into the fiber's inner cladding through a side of the fiber, which in turn couples the beam into an active portion of the double-clad fiber having a doped core.

10. A pump-coupler package of claim 9, wherein the multimode laser diode comprises, A submount having a top surface, and A chip including the active region mounted on the submount's top surface and emitting the beam parallel to the mounting surface.

11. A pump-coupler package of claim 9, wherein the multimode laser diode comprises, A submount having an end surface, and A chip including the active region mounted on the submount's end surface and emitting the beam perpendicular to the mounting surface, and Further comprising a turning mirror that folds the beam so that it is emitted parallel to the mounting surface.

12. A pump-coupler package of claim 9, wherein the beam rotator comprises first and second reflective surfaces that perform a pair of "off-plane bounces" to rotate the beam so that the beam and its fast-axis are oriented substantially parallel to the active region.

13. A pump-coupler package of claim 12, wherein the mounting surface lies in the XZ-plane in an XYZ coordinate system an the diode emits the beam along the Z-axis with its fast-axis along the Y-axis, the first reflective surface folds the beam along the Y-axis and its fast-axis along the Z-axis and the second reflective surface folds the beam along the X-axis and leaves the fast-axis along the Z-axis.

14. A pump-coupler package of claim 13, wherein said first and second reflective surface form an angle of approximately 60° to each other.

15. A pump-coupler package of claim 13, wherein the first and second reflective surface are provided from a pair of mirrors, a prism or a tilted v-groove mirror.

16. A pump-coupler package of claim 9, further comprising;

A diode package that houses the multimode laser diode and the beam rotator,

A window formed in the diode package through which the beam is emitted to the lens; and A pump-coupler package that houses the diode package, the lens, the side coupler and the double-clad fiber, said pump-coupler packaging having at least one port formed therein through which at least one end of the double-clad fiber extends.

17. A pump-coupler package of claim 9, further comprising;

A pump-coupler package that houses the diode, beam rotator, lens, side coupler and double-clad fiber, said pump-coupler packaging having at least one port formed therein through which at least one end of the double-clad fiber extends.

18. A pump-coupler package of claim 9, wherein the double-clad fiber presents an elliptical aperture to the beam at the side-coupler.

19. A pump-coupler package of claim 18, wherein the side-coupler comprises a V-groove formed in the fiber's outer cladding.

20. A pump-coupler package of claim 18, wherein the double-clad fiber's inner cladding has a flat surface, said side-coupler comprising a Total Internal Reflection (TIR) coupler mounted on the flat surface of the fiber's inner cladding.

21. The pump-coupler package of claim 20, wherein the TIR coupler is in optical contact with the inner cladding's flat surface towards an I/O port for receiving the incident beam for a length L and having a reflecting surface that forms an angle of taper $\alpha$ with said inner cladding, said TIR coupler being effective to reflect the beam at a preselected angle of incidence $\theta$ inc for the principal ray and satisfy a TIR condition at its reflecting surface for folding the beam into the double-clad fiber, wherein said beam also satisfies a TIR condition for guiding the beam inside the inner cladding.

22. The pump-coupler package of claim 21, the beam is oriented substantially normal to the waveguide so that the angle of incidence $\theta_{inc}$ at the reflecting surface is substantially equal to the angle of taper $\alpha$.

23. The pump-coupler of claim 22, wherein said inner cladding has a diameter W, said beam has a beam width d, the refractive indices of the TIR coupler, the inner cladding and an outer cladding are $n_{coupler}$, $n_{clad}$ and next respectively, and said beam is incident on the reflecting surface a distance D from the starting point of the taper as projected onto the fiber, said folding and guiding TIR conditions and said input and output coupling conditions being as follows:

$$\alpha > \arc\sin(1/n_{coupler}) \quad (1)$$

$$\theta_L > \arc\sin(n_{ext}/n_{clad}) \quad (2)$$

$$(\|D\|+d/2)/\cos(\theta_i) < L \quad (3)$$

$$L < (\|D\|-d/2)/\cos(\theta_i) + 2W\tan(\theta_L) \quad (4)$$

$$d < 2W\tan(\theta_L)\cos(\theta_i) \quad (5)$$

where $\theta_i$ is an angle of incidence of the beam at the interface of the TIR coupler and inner cladding and $\theta_L$ is a launch angle of the beam into the fiber.

24. The amplifier of claim 20, wherein said double-clad fiber includes a passive double-clad fiber having an undoped core surrounded by the inner cladding, which is optically coupled to an active double-clad fiber having a doped core surrounded by the inner cladding, said TIR coupler being mounted on said passive double-clad fiber to fold the beam into said passive fiber and guide the beam through and excite the entire length of the doped core in the active fiber.

25. A pump-coupler package of claim 18, wherein the side-coupler couples the beam directly into the active portion of the double-clad fiber having the doped core.

26. A pump-coupler package of claim 18, wherein the side-coupler couples the beam into a passive portion of the double-clad fiber having an undoped core.

27. A pump-coupler package for providing optical amplification, comprising:

A multimode laser diode including a chip mounted on a submount with the chip's active region parallel to a mounting surface, said chip emitting a beam parallel to the mounting surface with a fast-axis of the beam perpendicular to the mounting surface;

A passive double-clad fiber having an undoped core, an inner cladding and an outer cladding, a portion of the inner cladding having an exposed flat surface and mounted on the mounting surface adjacent the laser diode;

A beam rotator that rotates the beam so that the beam's fast-axis is oriented substantially parallel to the mounting surface and the fibers;

A lens that shapes the beam; and

A Total Internal Reflection (TIR) coupler mounted on the flat surface of the passive fiber's inner cladding that couples the shaped and properly oriented beam into the passive fiber's inner cladding through a side of the fiber, which in turn couples the beam into the active fiber.

28. A pump-coupler package of claim 27, wherein the beam rotator comprises first and second reflective surfaces that perform a pair of "off-plane bounces" to rotate the beam so that the beam and its fast-axis are oriented substantially parallel to the active region.

29. A pump-coupler package of claim 28, wherein the mounting surface lies in the XZ-plane in an XYZ coordinate system an the diode emits the beam along the Z-axis with its fast-axis along the Y-axis, the first reflective surface folds the beam along the Y-axis and its fast-axis along the Z-axis and the second reflective surface folds the beam along the X-axis and leaves the fast-axis along the Z-axis.

30. The pump-coupler package of claim 27, wherein the TIR coupler is in optical contact with the inner cladding's flat surface towards an I/O port for receiving the incident beam for a length L and having a reflecting surface that forms an angle of taper $\alpha$ with said inner cladding, said TIR coupler being effective to reflect the beam at a preselected angle of incidence $\theta inc$ for the principal ray and satisfy a TIR condition at its reflecting surface for folding the beam into the double-clad fiber, wherein said beam also satisfies a TIR condition for guiding the beam inside the inner cladding.

* * * * *